US009785060B2

(12) United States Patent
Beerens et al.

(10) Patent No.: US 9,785,060 B2
(45) Date of Patent: Oct. 10, 2017

(54) STAGE SYSTEM AND LITHOGRAPHIC APPARATUS COMPRISING SUCH STAGE SYSTEM

(71) Applicant: ASML Netherlands B.V., Veldhoven (NL)

(72) Inventors: Ruud Antonius Catharina Maria Beerens, Roggel (NL); Rob Johan Theodoor Rutten, Eindhoven (NL); Jan Steven Christiaan Westerlaken, Heesch (NL); Koen Jacobus Johannes Maria Zaal, Eindhoven (NL); Richard Henricus Adrianus Van Lieshout, Batenburg (NL); Engelbertus Antonius Fransiscus Van Der Pasch, Oirschot (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 14/423,405

(22) PCT Filed: Aug. 19, 2013

(86) PCT No.: PCT/EP2013/067253
§ 371 (c)(1),
(2) Date: Feb. 23, 2015

(87) PCT Pub. No.: WO2014/044477
PCT Pub. Date: Mar. 27, 2014

(65) Prior Publication Data
US 2015/0227060 A1   Aug. 13, 2015

Related U.S. Application Data

(60) Provisional application No. 61/702,634, filed on Sep. 18, 2012.

(51) Int. Cl.
*G03F 7/20* (2006.01)
*G01D 5/38* (2006.01)
*G01D 5/34* (2006.01)

(52) U.S. Cl.
CPC .......... *G03F 7/70725* (2013.01); *G01D 5/34* (2013.01); *G01D 5/38* (2013.01); *G03F 7/70775* (2013.01); *G03F 7/70933* (2013.01)

(58) Field of Classification Search
CPC .. G03F 7/70775; G03F 7/70716; G03F 7/707; G03F 7/70933; G03F 7/70725; G01D 5/347; G01D 5/38; G01D 5/34
See application file for complete search history.

(56) References Cited

U.S. PATENT DOCUMENTS 5,066,130 A * 11/1991 Tsukiji ................. G01D 5/38
250/237 G
5,469,260 A   11/1995 Takagi et al.
(Continued)

FOREIGN PATENT DOCUMENTS

CN   1717779 A   1/2006
CN   1952786     4/2007
(Continued)

OTHER PUBLICATIONS

Japanese Office Action mailed Jan. 5, 2016 in corresponding Japanese Patent Application No. 2015-532350.
(Continued)

Primary Examiner — Steven H Whitesell Gordon
(74) Attorney, Agent, or Firm — Pilsbury Winthrop Shaw Pittman LLP

(57) ABSTRACT

A stage system includes a movable stage, and an encoder for measuring a position of the stage, wherein the encoder includes an emitter for emitting an encoder beam, a grating for interacting with the encoder beam, and a detector for
(Continued)

detecting the encoder beam having interacted with the grating, the encoder beam in use propagating along an optical path; a purging cap at least partly enclosing the optical path; and a purging medium supply device for supplying a purging medium into the purging cap.

19 Claims, 3 Drawing Sheets

(56) References Cited

U.S. PATENT DOCUMENTS

| | | | |
|---|---|---|---|
| 5,875,031 A * | 2/1999 | Owa | G01B 9/02052 |
| | | | 356/500 |
| 5,877,843 A | 3/1999 | Takagi et al. | |
| 6,542,220 B1 | 4/2003 | Schrijver et al. | |
| 7,253,875 B1 | 8/2007 | Luttikhuis et al. | |
| 8,243,279 B2 | 8/2012 | Ishizuka | |
| 2001/0026355 A1 * | 10/2001 | Aoki | G03F 1/64 |
| | | | 355/30 |
| 2005/0275835 A1 * | 12/2005 | Sogard | B82Y 10/00 |
| | | | 356/237.2 |
| 2009/0122293 A1 | 5/2009 | Shibazaki | |
| 2009/0268210 A1 * | 10/2009 | Prince | G01D 5/347 |
| | | | 356/494 |
| 2010/0134769 A1 * | 6/2010 | Mulkens | G03B 27/32 |
| | | | 355/30 |
| 2011/0032496 A1 | 2/2011 | Shibazaki | |
| 2011/0199601 A1 * | 8/2011 | Kaneko | G03F 7/70341 |
| | | | 355/72 |
| 2011/0304839 A1 | 12/2011 | Beerens et al. | |
| 2012/0052447 A1 | 3/2012 | Westerlaken et al. | |

FOREIGN PATENT DOCUMENTS

| | | |
|---|---|---|
| CN | 102314092 A | 1/2012 |
| EP | 1 777 590 | 4/2007 |
| JP | S59-117614 | 7/1984 |
| JP | 60-184851 | 9/1985 |
| JP | S63-313002 | 12/1988 |
| JP | H06-41629 | 11/1994 |
| JP | 8-82509 | 3/1996 |
| JP | H10-193627 | 7/1998 |
| JP | 2001-044112 | 2/2001 |
| JP | 2001-60548 | 3/2001 |
| JP | 2001-160552 | 6/2001 |
| JP | 2002-329906 | 11/2002 |
| JP | 2005-166922 | 6/2005 |
| JP | 2006-052846 | 2/2006 |
| JP | 2007-185878 | 7/2007 |
| JP | 2007-278115 | 10/2007 |
| JP | 2009-158973 | 7/2009 |
| JP | 2010-78566 | 4/2010 |
| JP | 2014-007417 | 1/2014 |
| KR | 2001-0095087 | 11/2001 |
| NL | 2006220 | 8/2011 |

OTHER PUBLICATIONS

International Search Report and Written Opinion mailed Jan. 3, 2014 in corresponding International Patent Application No. PCT/EP2013/067253.
Chinese Office Action mailed Jan. 20, 2016 in corresponding Chinese Patent Application No. 2016011501246180.
Korean Office Action mailed Jun. 21, 2016 in corresponding Korean Patent Application No. 10-2015-7009939.
Japanese Office Action issued Aug. 9, 2016 in corresponding Japanese Patent Application No. 2015-532350.

* cited by examiner

STAGE SYSTEM AND LITHOGRAPHIC APPARATUS COMPRISING SUCH STAGE SYSTEM

CROSS-REFERENCE TO RELATED APPLICATIONS

This application is the U.S. national phase entry of International Patent Application No. PCT/EP2013/067253, filed Aug. 19, 2013, which claims the benefit of priority from US provisional application 61/702,634, which was filed on Sep. 18, 2012, and which is incorporated herein in its entirety by reference.

FIELD

The present invention relates to a stage system and to a lithographic apparatus comprising such stage system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A position of a movable stage of the lithographic apparatus, such as a substrate table constructed to hold the substrate, is measured by position sensors. Encoder based position sensors are commonly used for position measurement. For example, a stationary grating is connected to a reference structure of the lithographic apparatus, while a plurality of encoder heads are connected to the substrate table. Each encoder head is arranged to, in cooperation with the stationary grating, measure a position quantity (in one or more dimensions), allowing to determine a position of the substrate table in respect of the stationary grating. In such encoder type position sensors, an encoder beam propagates along an optical path, which optical path propagates in part through a medium, such as air, synthetic air or another gas or gas mixture. A position measurement as obtained from the encoder type position sensor, may hence exhibit a dependency on a propagation characteristic (e.g. a refractive index) of such medium, making the encoder type position measurement dependent on factors such as temperature, humidity, etc. A purging of the lithographic apparatus by a purging gas has been proposed. Still however, a too large inaccuracy may be obtained due to factors such as pressure fluctuations, thermal fluctuations, humidity fluctuations, etc.

SUMMARY

It is desirable to provide a stage system and lithographic apparatus comprising such stage system with a high accuracy of stage position measurement.

According to an embodiment of the invention, there is provided a stage system comprising:
a movable stage, and
an encoder type position measurement system for measuring a position of the stage,
wherein the encoder type position measurement system comprises an emitter for emitting an encoder beam, a grating for interacting with the encoder beam, and a detector for detecting the encoder beam after interaction with the grating, the encoder beam in operation propagating along an optical path
wherein the stage system further comprises
a purging cap enclosing a purging area at least partly comprising the optical path; and
a purging medium supply device for supplying a purging medium into the purging area.

In another embodiment of the invention, there is provided a lithographic apparatus arranged to transfer a pattern from a patterning device onto a substrate, comprising the movable stage according to an embodiment of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

Throughout the figures, the same or like reference numerals refer to the same or like parts.

DETAILED DESCRIPTION

Figure 1:
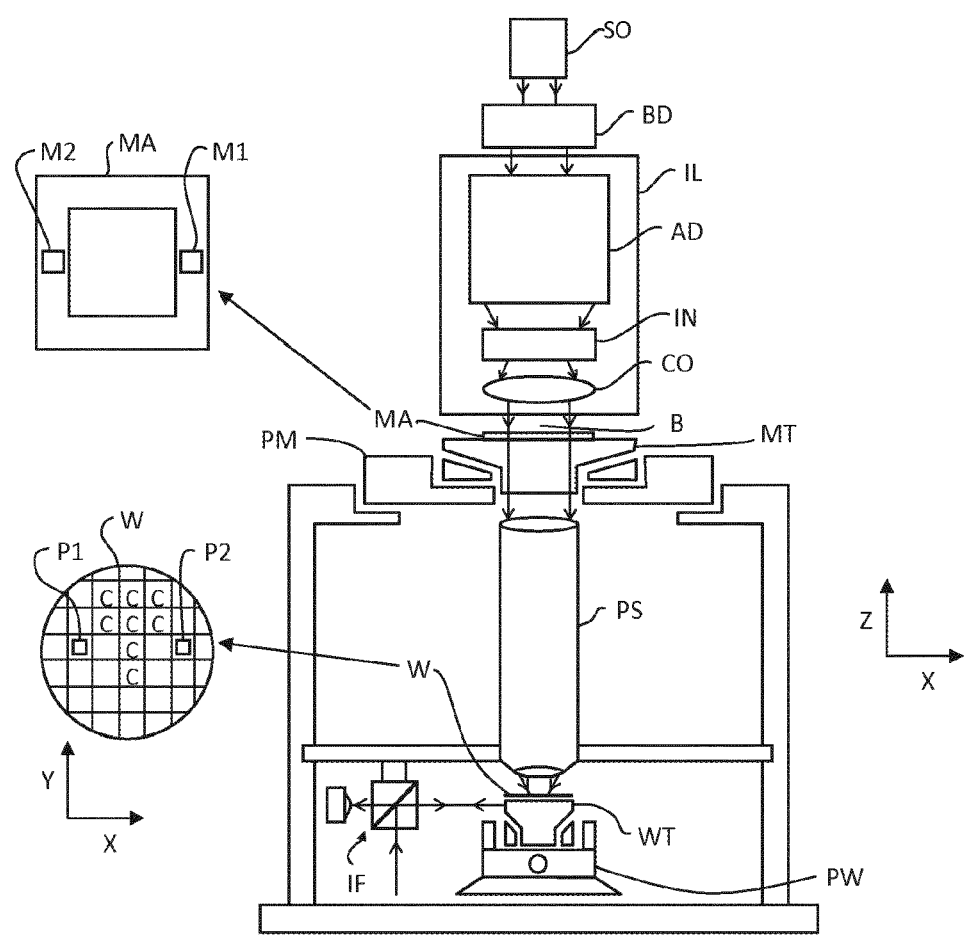
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a support structure or patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning deice (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a patterning device library, or during a scan. In general, movement of the support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the support structure (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

1. In step mode, the support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
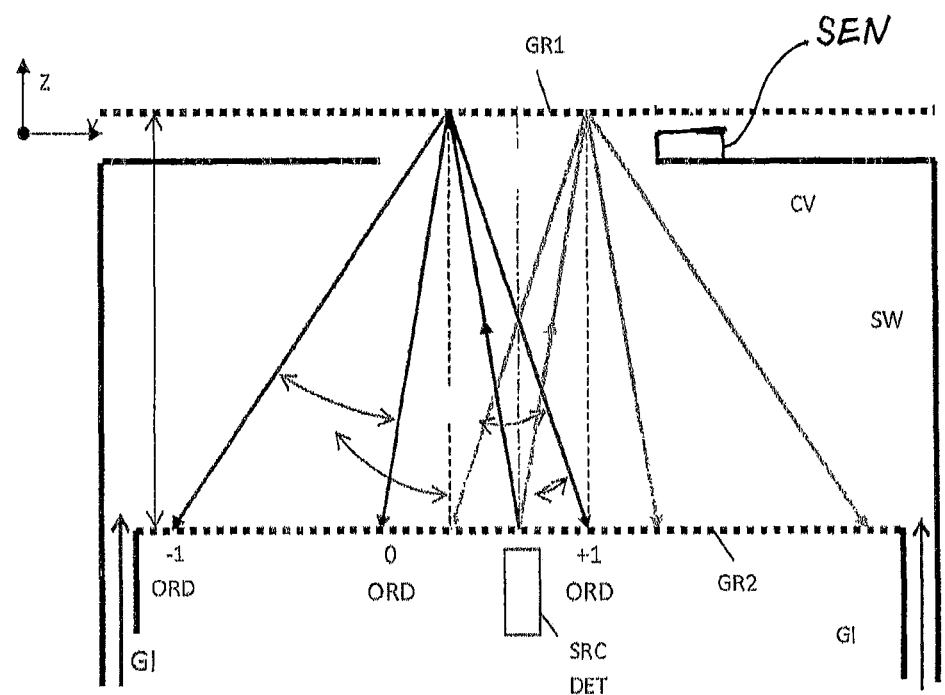
FIG. 2 depicts a schematic side view of an encoder type position measurement system of a stage system according to an embodiment of the invention.

FIG. 2 depicts a schematic side view of part of an encoder type position measurement system. It is noted that in this document the encoder type position measurement system may also be referred to as an encoder. The encoder type measurement system comprises a source SRC that is arranged to generate an optical beam (in this document referred to as an encoder beam). The source may for example be a laser, emitting for example a monochromatic laser beam. In the embodiment of the encoder depicted here, the encoder beam is diffracted by two gratings, namely first grating GR1 and second grating GR2. Other configurations are possible and described in for example NL2006220 and US 2011/0304839 A1. In the encoder configuration as depicted in FIG. 2, the encoder beam is diffracted by the second grating GR2, first order and minus first order diffraction beams propagating towards the first grating. At the first grating GR1, these beams are diffracted, providing zero 0 ORD, first order +1 ORD, and minus first order −1 ORD diffraction beams propagating towards the second grating again. From the second grating, the beams return along a similar path, providing a resulting beam to reach the detector DET of the encoder type position measurement system. In the depicted embodiment, the first grating is connected to a reference structure, while the second grating, source and detector are connected to the movable stage. Hence, as the movable stage moves in respect of the first grating, a change in the beam as received by the detector is observed. The detector may be any suitable type of photo detector, such as a photodiode. By the diffraction, the encoder beam may divide into multiple beams together forming the encoder beam propagating along an optical path.

According to an aspect of the invention, a purging cap PC is provided that encloses a purging area PA at least partly comprising the optical path. A purging medium supply device, in the depicted embodiment comprising the purging gas supply duct GI, supplies a purging medium, such as a purging gas into the purging area. Thus, a more constant propagation behavior of the medium along the optical path may be achieved, which may result in a more accurate encoder position sensing.

It is noted that, although the embodiment in FIG. 2 comprises 2 gratings, other configurations, for example omitting the second grating, are possible too. Furthermore, it is noted that instead of connecting the first grating to the (stationary) reference structure, and the source, detector and second grating to the movable stage, this configuration may also be reversed, i.e. connecting the first grating to the movable stage, and the source, detector and second grating to the (stationary) reference structure. The artisan skilled in the art of optics may appreciate a mini-environment as created by said purge cap in an application other than encoder based position sensing; e.g. non-stage related encoder systems or any other optical propagating beam subject to environmental disturbances harming the objected end-effect.

The purging medium may comprise a purging gas, such as air, synthetic air or another gas or gas mixture. Alternatively, the purging medium may comprise a vacuum or partial vacuum.

In an embodiment, as depicted in FIG. 2, the purging cap comprises a side wall SW and a cover CV, the cover may extend substantially parallel to the first grating. Thereby, a high shielding of the propagation path against effects (heath, pressure, humidity, gas streams) from surrounding gas may be achieved. Alternatively, the purging cap comprises a side wall only and is open at a top side thereof, allowing for example an easy retraction or height adjustment, without a risk that the purging cap interferes with the encoder beam.

The cover may comprise an opening to allow a passage of the encoder beam, hence avoiding an interaction between the encoder beam and the purging cap. The cover (i.e. the part of the cover outside the opening) may serve several purposes. On the one hand, purging gas that enters the purging area at the purging gas inlet, will discharge from the purging cap via a gap between the cover of the purging cap and the first grating. The cover of the cap, in particular when extending parallel to the first grating) will together with the first grating, form a discharging channel extending parallel to the first grating, and provide a pneumatic resistance, so as to reduce a discharging of the purging gas, hence allowing to lower a supply rate of the purging gas (thereby reducing a possible force on the movable stage as a result of purging gas stream and/or purging gas pressure. On the other hand, the cover of the purging cap may prevent to some extent that gas from outside the purging cap enters the purging cap via the opening, thus possibly reducing a risk of humidity, temperature, pressure or other variations in the purging area.

In the depicted embodiment, the opening is at a center of the cover, so as to provide substantially a same pneumatic resistance towards all directions, resulting in the stream of purging gas providing a substantially symmetrical force profile onto the purge cap and/or gratings, thereby reducing a potentially disturbing effect thereof. Still further, in the depicted encoder configuration, the diffracted beams that form the encoder beam are mutually closer together near the first grating, while they are mutually more remote near the second grating, causing an inhomogeneity along the optical path of the encoder beam to have more effect where the diffracted beams are more remote from each other. As the opening, and hence a possible disturbance in homogeneity, is located where the beams are more close together, an effect thereof may be less.

Figure 3:
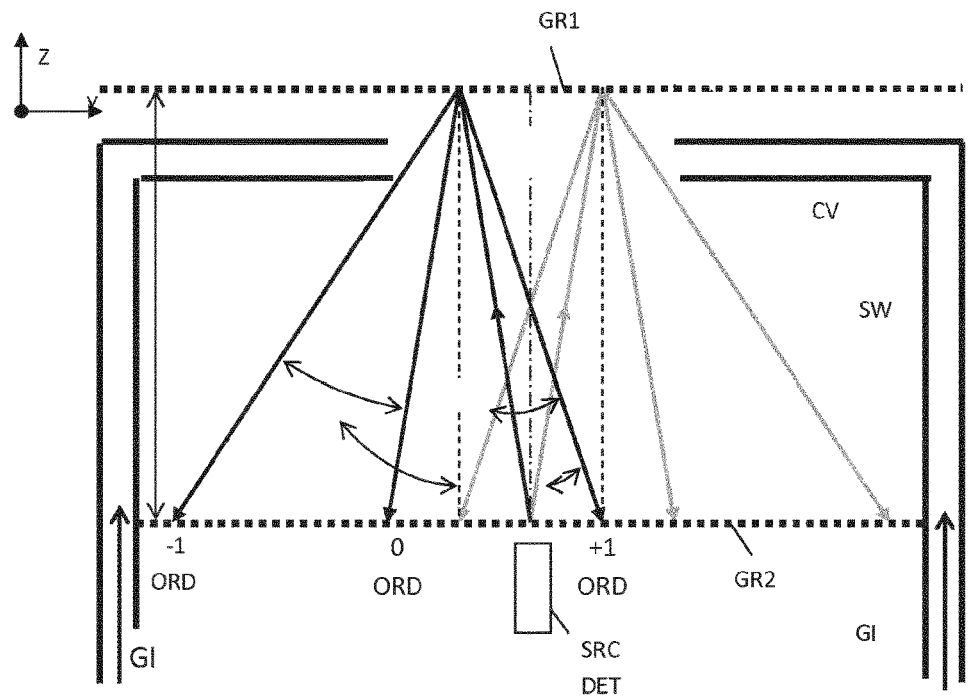
FIG. 3 depicts a schematic side view of an encoder type position measurement system of a stage system according to another embodiment of the invention.
Figure 4:
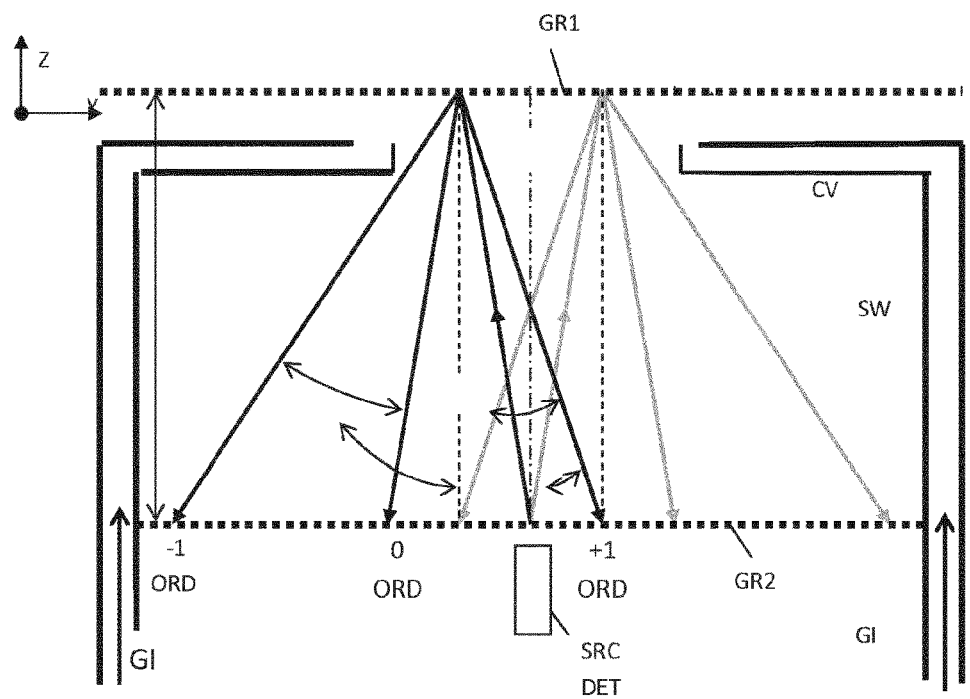
FIG. 4 depicts a schematic side view of an encoder type position measurement system of a stage system according to still another embodiment of the invention.

In the embodiment as depicted in FIG. 2, the purging gas supply duct GI of the purging medium supply device discharges at a bottom side of the purging area, in other words at a side of the purging area opposite the discharging opening, so as to enable a purging of the entire purging area. Another embodiment is schematically depicted in FIG. 3. In this embodiment, the purging gas supply duct GI extends along the side wall of the purging cap towards a top of the side wall. Thereby, it may be provided that the part of the purging area where the diffracted beams are more remote from each other, hence causing a higher local sensitivity of the position determination for inhomogeneity, is kept as quiet as possible, as a stream of the purging gas is largely guided towards the less critical area where the encoder beams are more close together. As depicted in FIG. 3, the purging gas supply duct may extend along the cover towards the opening and discharged into the opening, thus largely avoiding purging gas flow at the most sensitive area, hence keeping this sensitive area quiet and stable. FIG. 4 depicts a similar embodiment as depicted in FIG. 3, whereby the purging gas supply duct discharges into the gap between the purging cap and the first grating, so as to effectively shield the purging area from external effects.

It is noted that, in an alternative embodiment (not depicted) the purging cap may comprise an adjustable opening; e.g. a diaphragm that forms the opening. In combination with a cap that is movable in height, the diaphragm may for example be opened wider when lowered, so as to take account of the converging/diverging geometry of the diffraction beams, thus on the one hand avoiding interfering with the beams, while on the other hand avoiding an unnecessarily large opening.

In a further embodiment, the opening of purging cap is slot or cross shaped, so as to on the one hand keep the total effective size of the opening in the purging cap as small as possible, while on the other hand allowing the diffracted beams to pass through the slotted opening parts of the opening. Alternative shapes may include a circular or an ellipsoidal opening.

Generally, keeping the opening of the purging cap small, will allow reduction of a purging gas supply rate, hence reducing a possible force on the movable stage due to the stream of purging gas, and at the same time reduce a risk of disturbance of the purging area via the opening.

In another embodiment, the purging cap comprises a transparent cover, so as to allow a passage of the encoder beam through the cover, while allowing to further reduce a purging gas supply rate.

The purging cap may be substantially closed, so as to substantially close the purging area thus to a large extent preventing disturbances outside the purging cap to have an effect on the propagation characteristics of the medium along the optical path. Furthermore, the substantially closed purging cap enables application of a vacuum of partial vacuum therein, providing defined propagation characteristics along the optical path.

The cover of the purging cap may also extend along the first grating away from the purging area. Thereby, an interference of the cover with the interferometer beams may be prevented, while at the same time providing a form of shielding to keep disturbing effects away from the purging area, and/or providing a pneumatic resistance to a discharge flow of purging gas from the purging area. In particular when the purging cap is movable (e.g. movable over a range of movement in a direction towards and away from the first grating), this form of cover may allow a relatively large range of movement without the cover interfering with the encoder beam.

In an embodiment, the purging cap is retractable, so as to allow the purging cap to be retracted for example when the encoder in question passes a projection lens, thus avoiding that the purging cap could damage the projection lens of the lithographic apparatus. A suitable actuator may be provided to retract the cap. In an embodiment, the actuator is provided by the purging medium supply device, for example the actuator cap may be raised by a large stream of gas from the purging medium supply device, and lower due to gravity force when the stream of purging gas from the purging medium supply device is reduced.

In order to enable retract-ability, the side wall of the cap may be bellow shaped and formed from a flexible material. Many other embodiments are possible.

The substrate table of the lithographic apparatus may move so as to keep a to be exposed part of the substrate in a plane of focus of the projection system. As a result, a distance between the first and second grating of the encoder may vary. This variation in height may cause a gap between the cap and the first grating to vary, hence possible resulting in pressure variation as a discharging of the purging has may vary depending on a size of the gap, or causing a variation in a force onto the substrate table as a result of the purging gas stream discharging though the gap. Hence, a measurement of the height and/or pressure may be desirable thereto, in an embodiment, the purging cap comprises a sensor SEN (see FIG. 2) to measure at least one of a position of the purging cap and a gas pressure. The position sensor may for example be arranged to measure the gas between the purging cap and the first grating, for example by means of a capacitive position sensor. The gas pressure may be measured by the sensor in the purging area or in the gap between the purging cap and the first grating (a higher pressure indicating less purging gas discharge). A safety control may be provided based on an output of the sensor: an actuator may be provided to move the purging cap away from the first grating when the output of the sensor provides that the distance between the purging cap and the first grating is below a predetermined minimum.

Furthermore, a control system or controller may be provided to actively control a positioning of the purging cap based on the sensor output. At least part of the purging cap may be movable by a pressure difference between the purging area and a surrounding of the purging cap. To control a position of the purging cap, the purging medium supply device comprises a gas supply controller for controlling a gas supply rate, the gas supply controller comprising a measurement input, connected to the sensor, the gas supply controller being arranged to control the gas supply using the measurement result provided by the sensor. Hence, the gas supply rate may be adjusted to keep the purging cap at a desired position. The sensor may comprise a position sensor providing a signal representative of the distance between the purging cap and the first grating so as to keep the distance within a certain range. Alternatively, the sensor may provide a pressure signal so as to keep the purging gas pressure within a certain range (lowering the purging gas pressure may allow the purging cap to lower due to gravity and vice versa). Also, a combined control whereby position and pressure are measured, may be applied, offering additional degrees of freedom in the design of such control. For example, the purging gas pressure and gap may be held in a predetermined range. The gas supply rate may for example be controlled by a control valve.

It is noted that, instead of controlling a gas supply rate of the gas supply device, it is also possible to drive a position of the purging cap by any other suitable actuator, such as by means of an electric motor.

Although the above has described the purging cap in the context of an encoder type position measurement system of a substrate table, the same concept may also be applied for any other stage of a lithographic apparatus, such as a mask stage (i.e. a mask table, also referred to as a support to hold a patterning device).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage system comprising:
a movable stage;
an encoder type position measurement system for measuring a position of the stage, wherein the encoder type position measurement system comprises an emitter for emitting an encoder beam, a first grating for interacting with the encoder beam, and a detector for detecting the encoder beam after interaction with the first grating, the encoder beam in operation propagating along an optical path,
a purging cap enclosing a purging area at least partly comprising the optical path; and
a purging medium supply device for supplying a purging medium into the purging area,
wherein the purging cap comprises a side wall, a cover and an opening, which is uncovered, the cover extending substantially parallel to the first grating and the side wall extending to cover the emitter or the detector or both the emitter and the detector, the opening provided in the cover to allow a passage of the encoder beam.

2. The stage system according to claim 1, wherein the first grating is being connected to one of a movable part of the stage and a stationary part of the stage, the emitter, the detector, and the purging cap being connected to the other one of the movable part of the stage and the stationary part of the stage.

3. The stage system according to claim 1, wherein the purging medium comprises a purging gas.

4. The stage system according to claim 1, wherein the purging medium comprises a vacuum of partial vacuum.

5. The stage system according to claim 1, wherein the purging medium supply device comprises a purging medium supply duct extending along the side wall of the purging cap towards a top thereof.

6. The stage system according to claim 1, wherein the opening is an adjustable opening.

7. The stage system according to claim 1, wherein the purging cap comprises a transparent cover.

8. The stage system according to claim 1, wherein the purging cap substantially closes the purging area.

9. The stage system according to claim 1, wherein at least a part of the purging cap is retractable.

10. The stage system according to claim 1, wherein the side wall of the purging cap is bellow shaped.

11. The stage system according to claim 1, wherein the purging cap comprises a sensor to measure at least one of a position of the purging cap and a gas pressure.

12. The stage system according to claim 11, wherein the purging medium comprises a purging gas, the purging medium supply device comprises a gas supply controller for controlling a gas supply rate of the purging gas, the gas supply controller being connected to the sensor and being arranged to control the gas supply using a measurement result provided by the sensor.

13. The stage system according to claim 12, wherein the sensor comprises a position sensor and a pressure sensor, the gas supply controller being arranged to control the gas supply rate using a position measured by the position sensor and a pressure measured by the pressure sensor.

14. The stage system according to claim 12, wherein at least part of the purging cap is movable by a pressure difference between the purging area and a surrounding, the gas supply controller being arranged to control the gas supply rate so as to control the position of the purging cap.

15. A lithographic apparatus arranged to transfer a pattern from a patterning device onto a substrate, comprising the movable stage according to claim 1.

16. The lithographic apparatus according to claim 15, wherein the movable stage is a substrate table constructed to hold the substrate.

17. The stage system according to claim 1, wherein the purging cap is spaced apart from the first grating so that part of the optical path that extends between the purging cap and the first grating is provided outside of the purging area enclosed by the purging cap.

18. A stage system comprising:
 a movable stage;
 an encoder type position measurement system configured to measure a position of the stage, the encoder type position measurement system comprising an emitter configured to emit an encoder beam, a grating configured to interact with the encoder beam, and a detector configured to detect the encoder beam after interaction with the grating, the encoder beam in use propagating along an optical path;
 a purging cap enclosing a purging area at least partly comprising the optical path; and
 a purging medium supply device configured to supply a purging medium into the purging area,
 wherein the movable stage is configured to move a substrate to be patterned by a patterned beam of radiation or a patterning device configured to pattern a radiation beam to form the patterned beam of radiation, and
wherein the purging cap comprises a side wall, a cover and an opening, which is uncovered, the cover extending substantially parallel to the first grating and the side wall extending to cover the emitter or the detector or both the emitter and the detector, the opening provided in the cover to allow a passage of the encoder beam.

19. A lithographic apparatus comprising:
 a patterning device support configured to support a patterning device, the patterning device configured to pattern a beam of radiation to form a patterned beam of radiation;
 a substrate support configured to support a substrate;
 a projection system configured to project the patterned beam of radiation onto the substrate, and
 a stage system comprising:
  a movable stage configured to position one of the supports;
  an encoder type position measurement system configured to measure a position of the stage, the encoder type position measurement system comprising an emitter configured to emit an encoder beam, a grating configured to interact with the encoder beam, and a detector configured to detect the encoder beam after interaction with the grating, the encoder beam in use propagating along an optical path;
  a purging cap enclosing a purging area at least partly comprising the optical path; and
  a purging medium supply device configured to supply a purging medium into the purging area,
 wherein the purging cap comprises a side wall, a cover and an opening, which is uncovered, the cover extending substantially parallel to the first grating and the side wall extending to cover the emitter or the detector or both the emitter and the detector, the opening provided in the cover to allow a passage of the encoder beam.

* * * * *